United States Patent
Davis

(12)
(10) Patent No.: US 6,281,803 B1
(45) Date of Patent: Aug. 28, 2001

(54) CONTROL MAT MONITORING AND WARNING APPARATUS AND METHOD

(76) Inventor: Warren Frederick Davis, 43 Holden Rd., Newton, MA (US) 02465-1909

( * ) Notice: Subject to any disclaimer, the term of this patent is extended or adjusted under 35 U.S.C. 154(b) by 0 days.

(21) Appl. No.: 09/270,038

(22) Filed: Mar. 16, 1999

(51) Int. Cl.$^7$ .................................................. G08B 21/00
(52) U.S. Cl. ...................... 340/657; 340/666; 200/86 R; 361/179; 49/264
(58) Field of Search ..................... 340/657, 565, 340/522, 666, 665, 667; 200/86 R; 318/480; 361/179, 187; 49/264

(56) References Cited

U.S. PATENT DOCUMENTS

| | | | |
|---|---|---|---|
| 3,662,229 | * | 5/1972 | Graff ..................... 340/657 |
| 4,347,505 | * | 8/1982 | Anderson ............... 340/666 |
| 4,467,251 | | 8/1984 | Jönsson . |
| 4,467,391 | * | 8/1984 | Refoy ..................... 361/179 |
| 4,560,912 | | 12/1985 | Jönson . |
| 4,590,410 | | 5/1986 | Jönson . |
| 4,823,290 | * | 4/1989 | Fasack et al. ............ 364/550 |
| 4,888,532 | | 12/1989 | Jönson . |
| 5,453,734 | * | 9/1995 | Gandhi ................... 340/664 |
| 5,636,477 | * | 6/1997 | Hulse ..................... 49/264 |

OTHER PUBLICATIONS

Larco Switch Mats, Larco Manufacturing, Brainerd, MN 56401.
American National Standard for power operated pedestrian doors ANSI A156.10–1991, New York, NY 10036.

* cited by examiner

Primary Examiner—Jeffery Hofsass
Assistant Examiner—Anh La

(57) ABSTRACT

A control mat monitoring and warning apparatus and method in which the resistance of a control mat is monitored continuously while the mat remains in use. Deviations of the pattern of control mat resistance values in use from a nominal range of acceptable values is used to detect and report deterioration of the electrical performance characteristics of the control mat so that the mat can be removed from service and replaced in a timely manner. The disclosed invention also generates proper presence detection signals by compensating for the deteriorating electrical performance characteristics of the control mat, thereby extending the useful functional life of the control mat beyond the point at which the mat could otherwise function properly.

4 Claims, 8 Drawing Sheets

CONTROL MAT MONITORING AND WARNING APPARATUS AND METHOD

FIELD OF THE INVENTION

The disclosed invention relates to control mats used for presence detection in applications involving automatic pedestrian doors, and other situations. More particularly, it relates to the monitoring of control mat electrical integrity, providing warning of and compensating for deterioration of control mat performance.

BACKGROUND OF THE INVENTION

Control, or switch mats, which are typically used in such applications as actuating automatic pedestrian doors and providing safety areas around potentially dangerous machinery, function as simple electrical switches that operate under the weight of an object or person. The most common variety consists of a pair of flat parallel steel plates separated by an array of small, compressible, electrically insulating spacers, sealed within a tough vinyl jacket. Electrical leads are attached to the two plates. When an object or person of sufficient weight stands on the mat, the steel plates are forced into physical, and electrical, contact, thereby causing the electrical resistance between the mat leads to drop to a low value indicative of the presence of the person or object on the mat. When the object or person is removed from the mat, the contact between the steel plates is broken and the electrical resistance between the mat leads assumes an essentially infinite value indicative of the absence of sufficient weight, and, hence, the person or object, on the mat.

Control mats afford a number of distinct advantages over other methods of presence detection, such as microwave and infrared (IR) beam sensors. Unlike beam sensors, the detection area of a control mat is, generally, rectangular so that, in a pedestrian door application, control mats can provide detection coverage right up to the threshold and side-to-side to the door jambs. The detection area cannot be displaced by the sensor, in this case the mat, accidentally or intentionally being struck or tampered with, as can a beam sensor. Control mats are insensitive to variations of line voltage and, if proper interference suppression measures are employed, cannot be interfered with by nearby RF (radio frequency) transmitters or IR radiation from sunlight. Beam sensors, on the other hand, cannot be made completely immune to interference from RF and IR radiation because they use these media as their primary input. Also, control mats respond strictly to the weight of the person or object standing on them and they do not depend for detection upon any other special properties or characteristics, such as the state of motion or the microwave or IR reflectivity of the detected person or object, as do beam sensors.

Shortcomings of Control Mats

Control mats, while considered to be the most reliable known method for detecting the presence of a person or object (See U.S. Pat. Nos. 4,467,251, 4,560,912, 4,590,410 and 4,888,532), suffer from the serious disadvantage that they are electromechanical devices that are, unlike solid-state beam and other sensors, subject to physical wear and deterioration. Consequently, maintenance of the superior reliability of control mats for presence detection depends critically on careful mat maintenance and the replacement of mats whose electrical performance characteristics have deteriorated below acceptable limits (U.S. Patents, ibid). The ANSI (American National Standards Institute) A156.10 national standard for automatic pedestrian doors specifies an elaborate manual procedure for determining the functional integrity of control mats. However, this procedure is time-consuming, labor intensive and, furthermore, requires that the door be literally, or effectively, taken out of service while the test is being performed. As a practical result, the ANSI control mat test is not applied on a regular basis to maintain the safety of control mats used on automatic pedestrian doors. Often, the first time the ANSI test is applied to a mat is after an accident has already occurred due to severe mat performance deterioration.

Manufacturers of control mats and automatic pedestrian doors that use control mats specify that a Daily Safety Check be performed at least once a day to verify proper actuation of the door by the control mat. Unfortunately, the Daily Safety Check is far too crude a test to be able reliably to uncover subtle, yet important, changes in the electrical performance characteristics of a control mat. For example, mats often begin to fail by developing "bad spots" that do not respond as well as the unaffected areas of the mat to the presence of people and objects. Such bad spots often go undetected by the Daily Safety Check because the person performing the check does not verify proper actuation of the door from all areas of the mat. In fact, the instructions for performing the Daily Safety Check provided by manufacturers do not specify that all areas of the mat need to be checked. Moreover, aside from the failure to check all areas of the mat, the weight of the person making the test is very likely to exceed by a considerable margin the minimum weight that a properly functioning mat should be able to detect. Consequently, the mat may appear to be operating properly when the Daily Safety Check is performed, but, in fact, could already be in a severely deteriorated condition that could result in a serious failure and accident when a person of only slightly less weight steps onto the mat.

A further shortcoming associated with the use of control mats follows from the fact that the control electronics used with the mat to determine if a person or object is, or is not, present on the mat neither senses nor compensates for the possible deterioration of the electrical performance characteristics of the mat. Rather, in most cases, the control electronics "concludes" that there is a person or object on the mat when the mat resistance drops below some preestablished threshold value and, conversely, that there is nothing present on the mat when the mat resistance rises above the threshold value. This very simple algorithm tolerates some variation of the mat resistance. For example, the lower resistance value can rise above the ideal value of zero, and the upper resistance can fall below the ideal condition of an essential open circuit (infinite resistance). However, this algorithm is only tolerant of the variation; it neither senses the existence of the variation nor compensates for it. Consequently, the control electronics currently used with control mats incorporates no mechanism for detection and warning of the deteriorating condition of the mat to which it is attached. Likewise, the control electronics in current use with control mats exhibits no capacity to compensate for the deterioration of the mat so that the correct presence detection signal is generated even though the electrical performance characteristics of the mat have deteriorated significantly. The ability to compensate in this manner would afford an important margin of public safety by assuring that the door continues to be actuated properly and appropriately, even though the control mat is failing and would otherwise be incapable of proper operation of the door.

Accordingly, it is a purpose of the disclosed invention to provide a means for early detection of the deterioration of the electrical performance characteristics of control mats so that such mats can be identified and removed from service in a timely manner, thereby minimizing the possibility of accidents and injury. It is also a purpose of the disclosed invention to provide compensation for the deteriorating condition of control mats so that the correct presence detection signal is generated when the mat would otherwise be incapable of proper operation of the door.

PRINCIPLE OF OPERATION

When a control mat is functioning properly, the electrical resistance exhibited across the mat terminal leads is essentially infinite (open circuit condition) when there is no person or object on the mat. Conversely, when sufficient weight is placed on the mat—as when a person or object is on the mat—the electrical resistance exhibited across the mat leads is essentially zero (short circuit condition). Consequently, an histogram of the mat resistance over time as the mat is subjected to routine use will exhibit two "spikes," one at zero resistance, corresponding to times when the mat is activated by a person or object, and the other at infinity, corresponding to times when there is nothing on the mat. Except for possible spurious instrumental measurement errors, the histogram will contain no resistance measurements, or counts, in channels (bins) corresponding to values intermediate between zero and infinity.

As the electrical characteristics of a control mat begin to deteriorate, an area of the mat may develop that exhibits a small non-zero resistance value in response to the weight of a person or object, which would otherwise have produced a short circuit (zero resistance). If most of the mat is as yet unaffected, the mat resistance histogram will continue to exhibit the two characteristic spikes corresponding to zero and infinite resistance, but counts will begin to appear at an intermediate position corresponding to the small non-zero resistance of the "bad spot." The relative amplitude of the histogram in the bin, or channel, corresponding to the bad spot will depend on the statistical probability that a pedestrian happens to step on the bad spot in the course of normal use of the mat.

As the mat continues to deteriorate, more such "bad spots" may develop. Each may exhibit a different relatively small minimum resistance value, and the minimum value associated with any given bad spot may change slowly over time, typically increasing. Correspondingly, additional intermediate channels will appear in the resistance histogram of the mat, and the positions of these channels may shift slowly with time.

Eventually, the individual bad spots may coalesce, or a single initial bad spot may grow to occupy the entire area of the control mat. When this occurs, there will then be no spot on the mat capable of exhibiting zero resistance when stepped on, and the corresponding zero resistance "spike" of the histogram will disappear. As the mat continues to deteriorate subject to this condition, the absolute minimum mat resistance typically will increase slowly from its initial value of zero.

Another way that a control mat may deteriorate is through the establishment of an electrical conduction path, initially typically exhibiting a very high resistance value, between the top and bottom mat plates. This may occur with or without the simultaneous occurrence of bad spots of the type described above. Such conduction may be due to moisture, possibly contaminated with salts and other ground chemicals, infiltrating into the interior of the mat or the establishment of a rust "bridge" between the top and bottom mat plates. It may also result from the breakdown of the electrical characteristics of the material spanning the mat plates, either internally or externally, or the material used to insulate the mat leads. Though not actually occurring within the mat, the latter effect is indistinguishable, from the standpoint of the door control electronics, from the establishment of conduction within the mat itself. However established, the mat, including its leads, will no longer exhibit to the control electronics the characteristic infinite open circuit resistance when there is nothing on the mat. The effect on the histogram is that the spike corresponding to infinite resistance will be replaced by a spike at the position of the somewhat lower resistance value now exhibited by the mat, or mat leads, when there is nothing present. As the mat continues to deteriorate, this maximum upper resistance value will generally slowly decrease.

Yet another way in which the electrical performance characteristics of a control mat may deteriorate is through the appearance of erratic resistance values intermediate between the two extreme values that correspond to people and objects on and off the surface of the mat. Such values may appear essentially as "noise" as the mat resistance undergoes the transition between the two extreme values.

Thus, there are several conditions characteristic of the electrical deterioration of a control mat that manifest themselves in readily identifiable changes in the mat resistance histogram. Initially, the histogram will contain two spikes, one corresponding to zero resistance, and the other to infinite resistance. Thereafter, as the mat deteriorates, one, or both, of these spikes may drift slowly away from its initial extreme value. Moreover, the development of bad spots will manifest itself in the appearance of one or more histogram peaks corresponding to resistance values intermediate between the extreme resistance values currently exhibited by the mat. Erratic transition resistance values will appear in the histogram as apparently random peaks filling in the region of the histogram between the peaks corresponding to the extreme resistance values.

A representative embodiment of the disclosed invention develops an histogram, on a continual basis, of the mat resistance values exhibited as the mat is subjected to normal routine use, and does not interfere in any way with the normal use and operation of the door controlled by the mat. Suitable provision is made for the gradual decay of the influence of histogram counts with time, thereby allowing the histogram to reflect and follow the evolution of the deterioration of the mat while it is in use. Deviations of the mat resistance histogram from the ideal exhibiting only zero and infinite resistance channels is monitored automatically on a periodic basis. In particular, shifts of counts away from the extreme zero and infinite resistance channels, and the possible occurrence of intermediate peaks, as well as other irregularities of the histogram, are monitored in order to assess the current electrical condition of the mat. When the assessed condition crosses a predetermined acceptability threshold, the disclosed device provides warning information indicating that mat performance has deteriorated to an unacceptable level and that the mat should be taken out of service and replaced.

The disclosed invention also compensates for the deterioration of the electrical characteristics of the mat described above. This enables the device to generate and send the correct presence detection signal to the door control electronics in response to a person or object on the mat, even when the mat has deteriorated far beyond the point of being able properly to actuate the door by itself. Thus, the current invention affords a considerable measure of enhanced public safety by greatly extending the period of time that the door can be properly actuated by a deteriorating mat. This while the disclosed invention provides notice and warning that the mat is failing and should be taken out of service and replaced.

Because the disclosed invention is to be inserted preferentially between the door control electronics and the mat leads at the ends of the mat leads farthest from the mat, and because electrical changes, such as leakage conduction and open and short circuits, occurring within the mat leads are indistinguishable from similar conditions occurring within the mat itself, the disclosed invention serves to monitor, compensate and warn against deterioration of both the control mat and its associated electrical leads.

While the above discussion of the characteristics of control mat electrical performance deterioration and the discussion herein of a representative embodiment of the disclosed invention utilize the concept of an histogram of the control mat resistance and the changes that occur therein as the mat deteriorates, the histogram is by no means the only useful or effective working concept for these purposes. The salient point is recognition of the characteristic ways that aspects of the control mat resistance change as the mat deteriorates and the utilization of those recognized properties in the design of a method and apparatus capable of detecting and reporting the deterioration of the control mat, providing timely warning that the control mat should be removed from service and replaced, and, at the same time, extending the effective life of the control mat by compensating for its deterioration and, thereby, continuing to generate appropriate presence detection signals beyond the otherwise useful life of the mat.

Accordingly, it is an object of the disclosed invention to estimate and monitor the maximum and minimum resistance values exhibited by the control mat and leads to which it is attached as the mat and leads are subjected to, and remain in, normal use. It is further an object of the disclosed invention to detect the occurrence of, and monitor, mat bad spots by, in a representative embodiment of the invention, identifying anomalous peaks in the histogram of the mat resistance while the mat is in normal use. It is yet a further object of the disclosed invention to provide warning, and other information, of the deterioration of the performance characteristics of the mat and leads to which it is attached so that the mat can be taken out of service and replaced in a timely fashion.

Yet another object of the disclosed invention is to extend the effective functional life of the control mat to which it is attached by compensating for the deterioration of the performance characteristics of the mat and, thereby, continuing to generate appropriate presence detection signals in response to people and objects on the mat. Consequently, a further objective of the disclosed invention is to enhance public safety by continuing to generate appropriate presence detection signals beyond the normal useful life of the mat.

Another object of the disclosed invention is to provide continuous monitoring of the electrical performance characteristics of the mat to which it is attached, while the mat remains in use, to augment evaluation of the mat using the manual test specified by the ANSI A156.10 national standard.

DETAILED DESCRIPTION OF THE INVENTION

Figure 1:
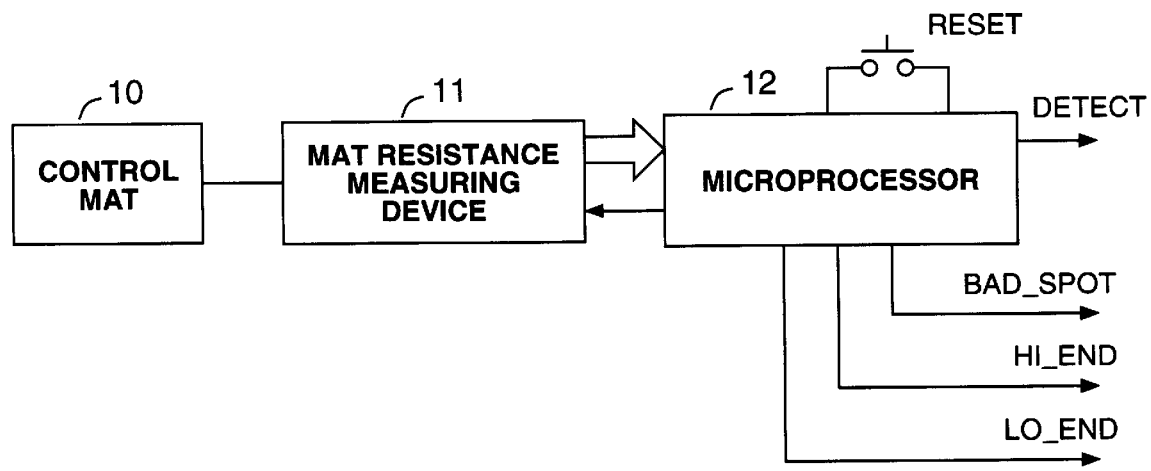
FIG. 1 is a flow chart identifying the major functional components of the disclosed invention and their interconnection.

With reference to FIG. 1, the major functional components of the disclosed invention include the control mat 10 whose electronic characteristics are to be monitored and evaluated, a mat resistance measuring device 11 and, in a representative embodiment, a programmed microprocessor 12 used to evaluate the condition of the mat on a continuous basis, to generate a proper presence detection signal when a person or object is on the control mat 10 even when the condition of the mat is deteriorating, and to provide continuous warning and other information relating to the electrical performance characteristics of the mat 10 so that the mat can be removed from service and replaced when warranted. Present technology dictates that these functions assigned to 12 are best realized by a programmed microprocessor, as illustrated. However, these functions can also be implemented by other means as, for example, by dedicated digital and analog circuitry using discrete components.

The mat resistance measuring device 11 utilizes prior art technology to provide sampled values, or estimates, of the instantaneous resistance of the control mat 10 to the microprocessor 12 either on demand from the microprocessor, or automatically on a periodic basis. For pedagogical purposes, the mat resistance measuring device 11 is illustrated in FIG. 1 as being distinct from the microprocessor 12. However, part of the resistance measuring device functionality could usefully be realized by the microprocessor 12 as well. In any case, the mat resistance measuring device utilizes techniques and methods well known to those skilled in the art and the details of its implementation do not fall within the scope of the current invention.

In order that the presence detection signal generated by the microprocessor 12 be satisfactorily responsive, the mat resistance measuring device should be capable of providing adequately resolved measurement values on the order of once every 50 milliseconds (ms). For the sake of definiteness in describing a representative embodiment, the basic mat resistance measurement interval will be taken to be 50 ms.

Figure 3:
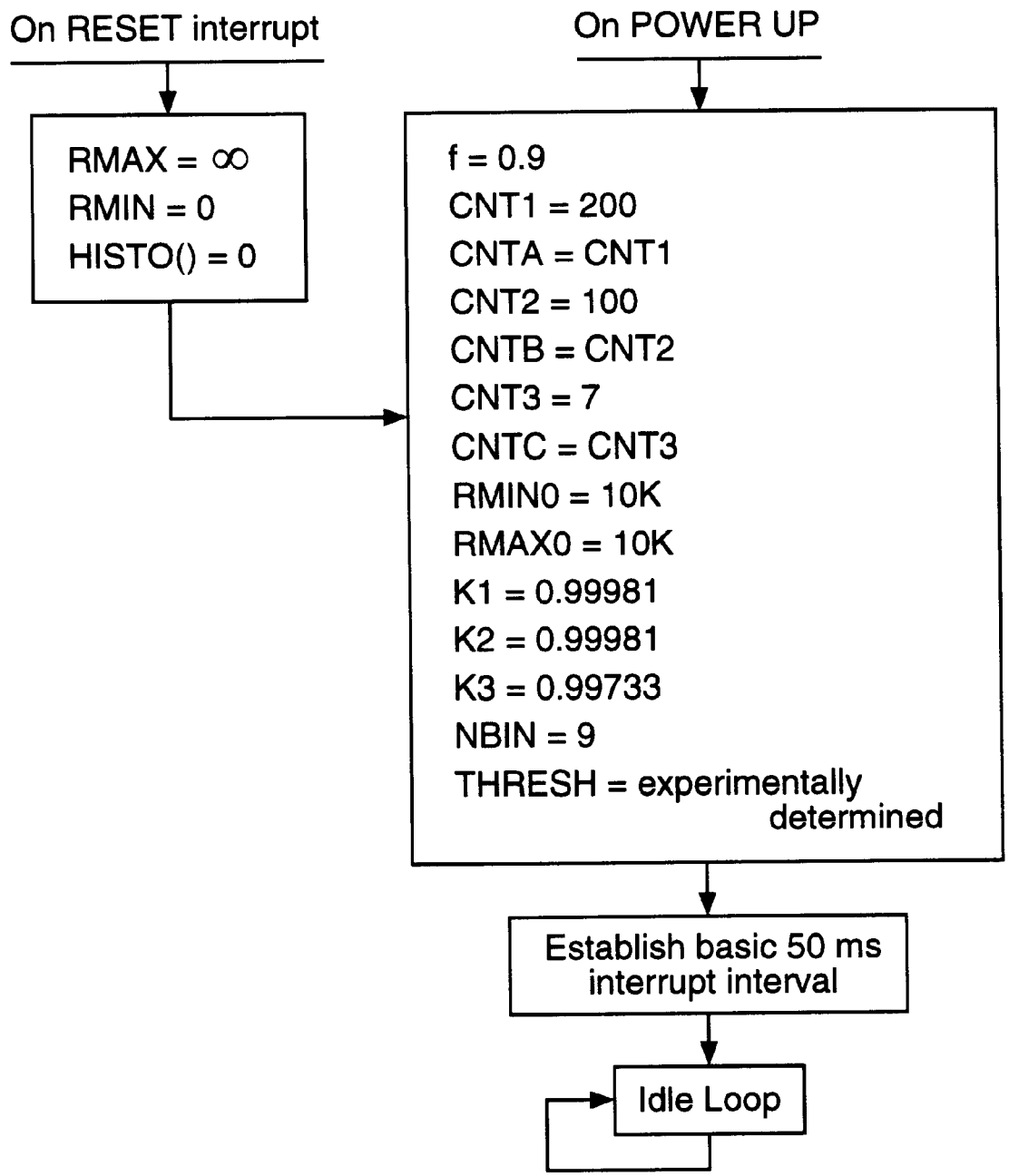
FIG. 3 is a flow chart illustrating the initialization steps associated with the detection and compensation algorithm implemented within the microprocessor 12 in a representative embodiment of the disclosed invention.

FIG. 3 illustrates the initialization steps carried out by the programmed microprocessor 12 in a representative embodiment of the disclosed invention. On POWER UP, a set of parameter constants used by the various algorithms to be described is initialized. Initialization of certain additional parameters and data is reserved for occurrence of the RESET interrupt, whose function is also to be described. After initialization of values, the basic 50 ms interrupt interval is established and the microprocessor falls into in endless idle loop.

The remaining operations of the programmed microprocessor are accomplished in response to the periodic 50 ms interrupt. In particular, on receipt of each 50 ms interrupt, the operations of the idle loop shown in FIG. 3 are suspended and program control is transferred to the point illustrated in FIG. 4a labelled "On 50 ms INTERRUPT." On termination of the operations triggered by receipt of the 50 ms interrupt, control is resumed within the idle loop at the point at which it was suspended. This is a standard technique well known to those skilled in the art. The hardware functionality required to implement such interrupt generation and servicing is commonly provided by modem off-the-shelf microprocessors and is in routine use.

The use of microprocessor interrupt technology to implement the basic 50 ms mat resistance measurement interval is not unique. For example, the idle loop shown in FIG. 3 itself could be used to time out 50 ms intervals and to switch control on each time out to the operations beginning at the top of the flow chart in FIG. 4a. The use of interrupt technology for this purpose in the representative embodiment described here is for purposes of illustration only. Other techniques and methods for accomplishing the same or similar functionality are well known and will be obvious to those skilled in the art.

Main Processing Program

Figure 4A:
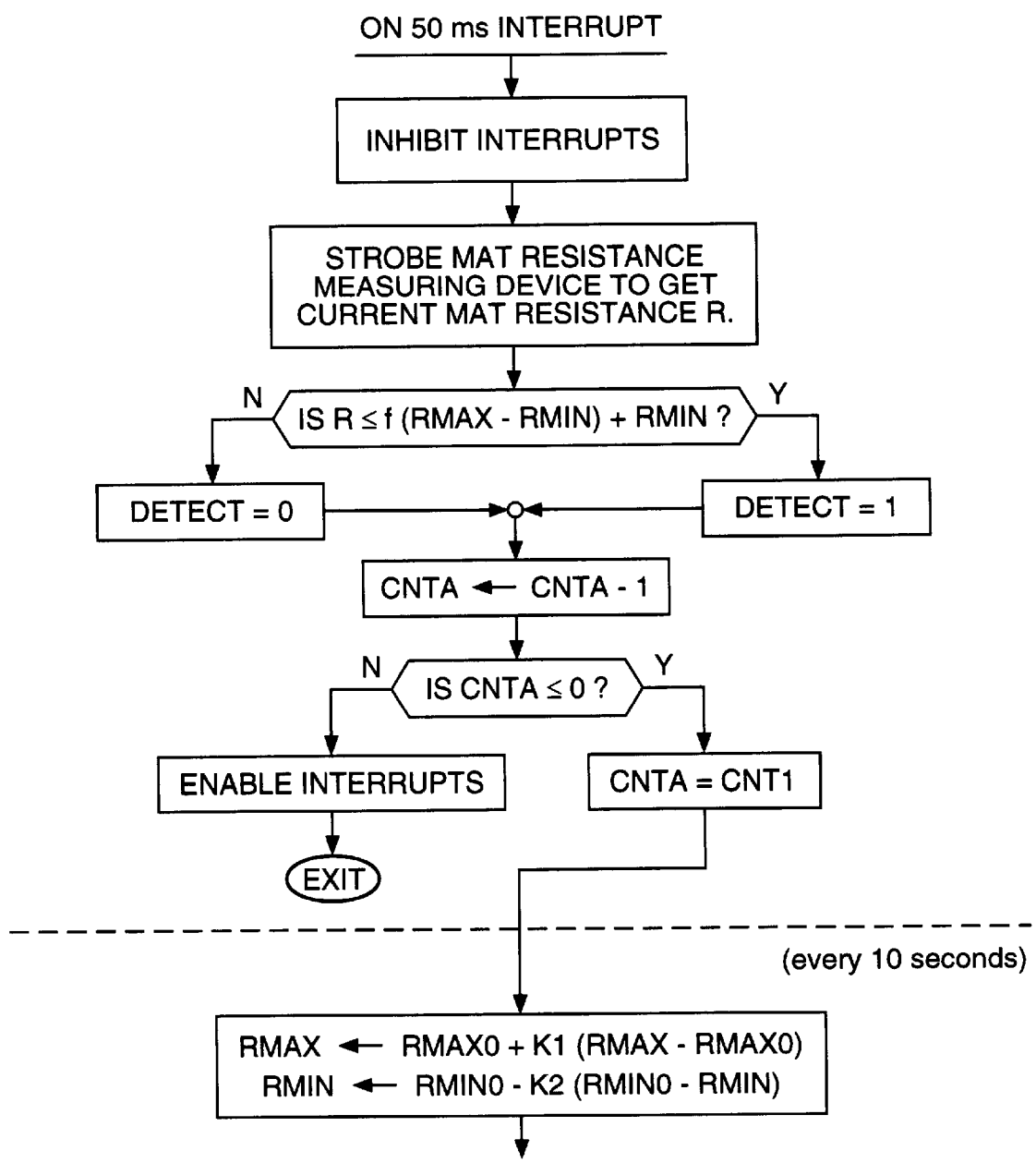
FIGS. 4a–4c are flow charts illustrating the detection and compensation algorithm implemented within the microprocessor 12 in a representative embodiment of the disclosed invention.

With reference now to FIG. 4a, on receipt of the interrupt, which occurs once every 50 ms, control transfers to the point labelled "On 50 ms INTERRUPT." In the representative embodiment, the next step is to inhibit further interrupts. This is because the operations to be performed, and which are illustrated schematically in FIGS. 4a, 4b and 4c, must be carried through to completion. If, in the process of doing so, 50 ms passes and another 50 ms interrupt is generated, it should be ignored. This condition will simply result in the loss of a mat resistance measurement datum which, it will be appreciated, is of no great significance due to the statistical nature of the algorithm that is described and implemented.

Next, the mat measurement device is strobed to obtain the current measured, or estimated, value of the control mat resistance R. Since the first priority of the microprocessor 12 program is to generate a proper and timely presence detection signal, the measured value of the mat resistance R is immediately compared with the current estimates of the maximum and minimum mat resistances, RMAX and RMIN, respectively. On receipt of the RESET interrupt, RMAX and RMIN are initialized to values representing infinite and zero mat resistance, respectively, as indicated in FIG. 3. These initial values represent the characteristics of an ideal control mat but, as will be described, RMAX and RMIN are gradually adjusted under program control to reflect the true maximum and minimum resistance values exhibited by the mat if different from the ideal. More particularly, if the current value of the control mat resistance R falls below a preset fraction f of the range between RMAX and RMIN, it is deemed that a person or object is present on the control mat and the presence detection signal is generated by setting DETECT=1. Otherwise, the presence detection signal is turned off by setting DETECT=0.

The details of how the setting of the variable DETECT to 0 or 1 is translated into the corresponding detection signal DETECT shown as an output of the microprocessor 12 in FIG. 1 will be to some extent microprocessor dependent but, in any case, will be obvious to those skilled in the use and application of such microprocessors and the techniques of real time process control. These details are not illustrated or discussed here.

The result of the foregoing is that a presence detection signal DETECT is generated within 50 ms, and on the average 25 ms, of the time that an object or person steps onto the control mat 10. Furthermore, because the generation of the presence detection signal is scaled to the currently estimated values of the maximum and minimum resistance, RMAX and RMIN, exhibited by the control mat, the detection signal can be generated correctly, even when the electrical characteristics of the control mat have deteriorated considerably. Otherwise, without the disclosed invention, the control electronics (not shown) to which the mat would be connected directly may be unable to produce proper actuation of the controlled door due to the severely deteriorated electrical condition of the control mat.

Continuing on with the flow chart in FIG. 4a, a counter CNTA is next decremented by 1. As shown in FIG. 3, the initial value of CNTA is CNT1. When CNTA is decremented to zero, CNTA is reinitialized to CNT1 and control continues on to the setting of RMAX and RMIN. Otherwise, if CNTA is not decremented to zero, interrupts are re-enabled and control is returned to the idle loop shown in FIG. 3 via the EXIT in FIG. 4a. In the representative embodiment of the disclosed invention, CNT1 has the value 200. Therefore, control continues on to the setting of RMAX and RMIN only on every $200^{th}$ 50 ms interrupt, or once every 10 seconds.

The operations shown at the bottom of the flow chart in FIG. 4a implement a so-called infinite impulse response (IIR) digital filter of the estimates of the maximum and minimum resistance values RMAX and RMIN exhibited by the control mat 10. Specifically, the current value of RMAX is allowed to decay downward, via the constant K1, toward the value RMAX0. Likewise, RMIN is allowed to decay upward, via the constant K2, toward the value RMIN0. The values of RMIN0 and RMAX0 shown in FIG. 3 are suggested starting values. In practice, other suitable values may be used. See FIG. 2. K1, K2, RMAX0 and RMIN0 are initialized on POWER UP or on RESET as illustrated in FIG. 3.

Figure 4B:
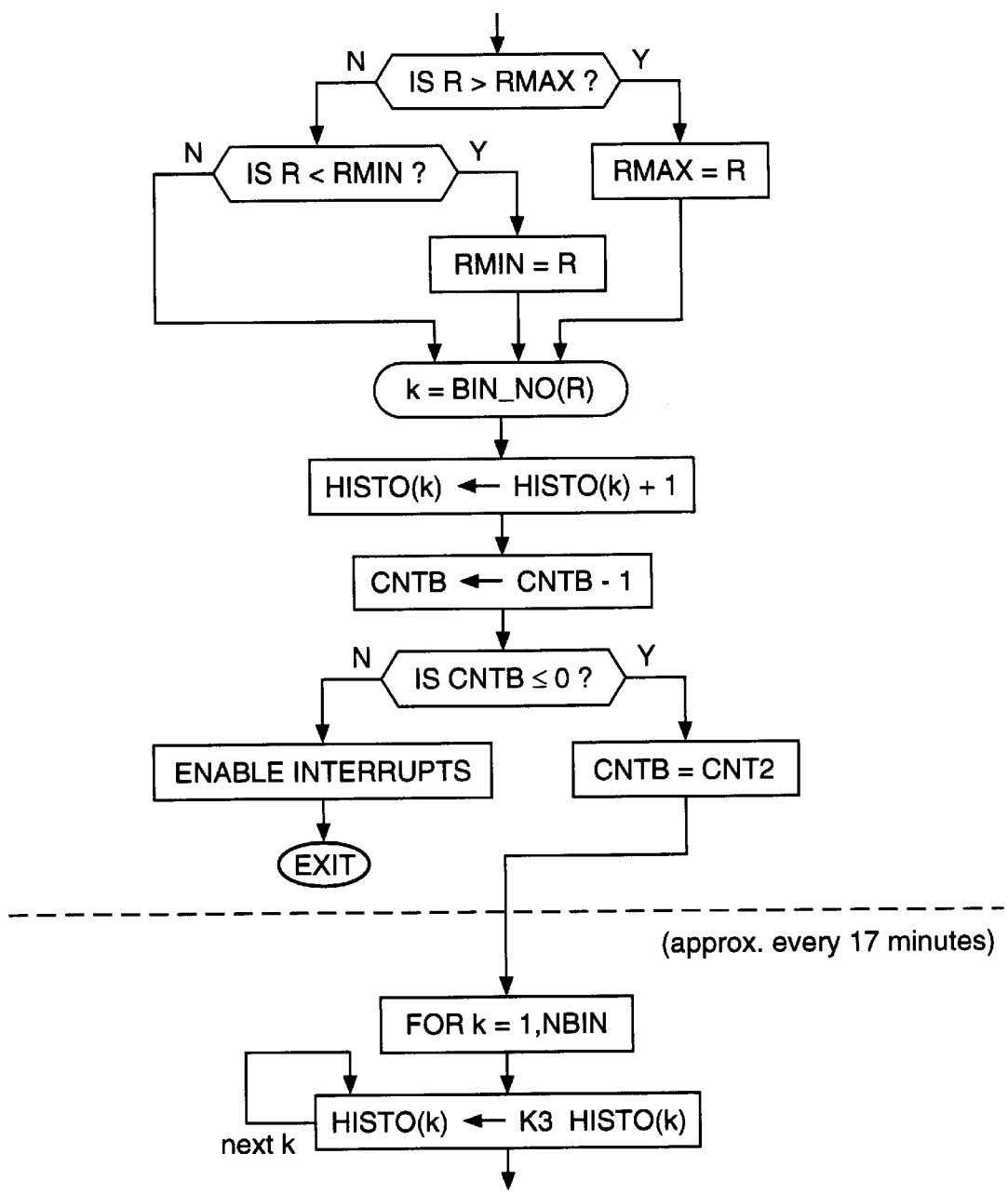

Referring now to FIG. 4b, the current measured, or estimated, value of the control mat resistance R, that is, the value of R measured every 10 seconds, is compared with the current estimates of the maximum and minimum resistance values RMAX and RMIN exhibited by the control mat 10. If the current value of R exceeds RMAX, the current estimate of the maximum control mat resistance, RMAX is adjusted upward to R. Conversely, if the current value of R is less than RMIN, the current estimate of the minimum control mat resistance, RMIN is adjusted downward to R. In this way, RMAX and RMIN always contain estimates of the maximum and minimum control mat resistance, subject to a tendency to decay away from the most recently observed extreme values. The purpose of the decay is to allow RMAX and RMIN to adjust to, and therefore reflect, slow variations of the extreme values of the control mat resistance.

Figure 2:
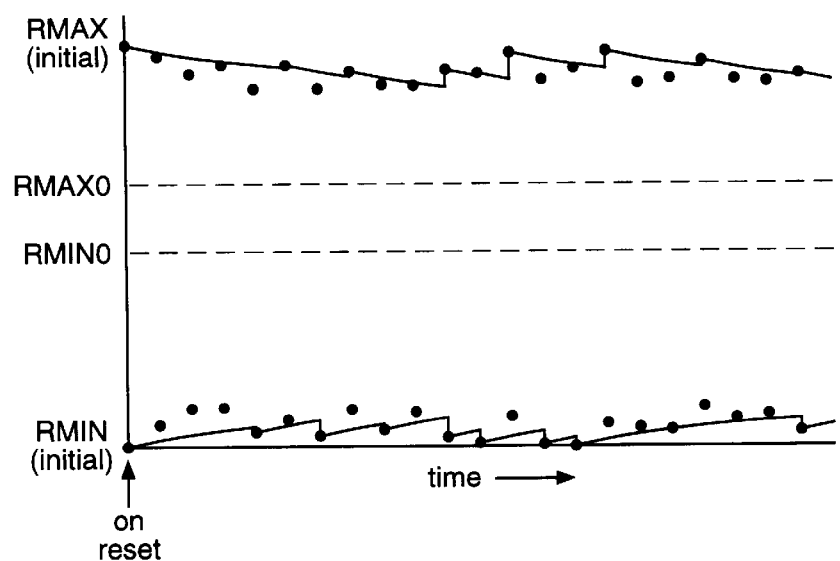
FIG. 2 is a schematic signal plot illustrating the manner of estimation of the parameters RMAX and RMIN over time.

This process is illustrated in FIG. 2. As shown in FIG. 3, RMAX and RMIN are initialized on RESET to values corresponding to infinite and zero control mat resistance, respectively. These initial values are illustrated at the extreme left of the schematic representation in FIG. 2. Thereafter, via the mechanism of the digital filters, RMAX decays downward toward RMAX0 until an R value obtained on the 10 second sampling interval, represented by the black dots in FIG. 2, exceeds the current value of RMAX, whereupon RMAX is immediately adjusted upward to the current value of R. Likewise, RMIN decays upward toward RMIN0 until an R value obtained on the 10 second sampling interval is encountered with a value less than the current value of RMIN, whereupon RMIN is immediately adjusted downward to the current value of R.

The clustering of R values (black dots) in FIG. 2 around an upper value and a lower value corresponds to the two basic conditions of a person or object on the control mat 10 (lower value) or not on the control mat (upper value). In practice, there are likely to be more samples corresponding to no person or object present on the control mat than on the control mat due to the fact that, unless pedestrian traffic is extremely heavy, the mat lies mostly idle. For this reason, the parameters of the digital filter that determine the behavior of RMAX, namely K1 and RMAX0, may usefully be set differently from those that determine the behavior of RMIN, namely K2 and RMIN0. However, for purposes of illustration, RMIN0=RMIN0 and K1=K2 in the initialization in FIG. 3.

For purposes of illustration, K1 and K2 have been set to values that result in the decay of RMAX and RMIN by one-half of the initial difference from RMAX0 and RMIN0, respectively, in 10 hours. At one sample every 10 seconds, this corresponds to 3600 samples. K1 (or K2) is determined from the relationship $$\rho = K^n \text{ or, } K = e^{\frac{\ln \rho}{n}} \quad (1)$$

where $\rho=\frac{1}{2}$, K=K1 or K2, and n is the number of samples, in this case n=3600. These values result in K1=K2=0.99981, as shown in FIG. 3.

Figure 5:
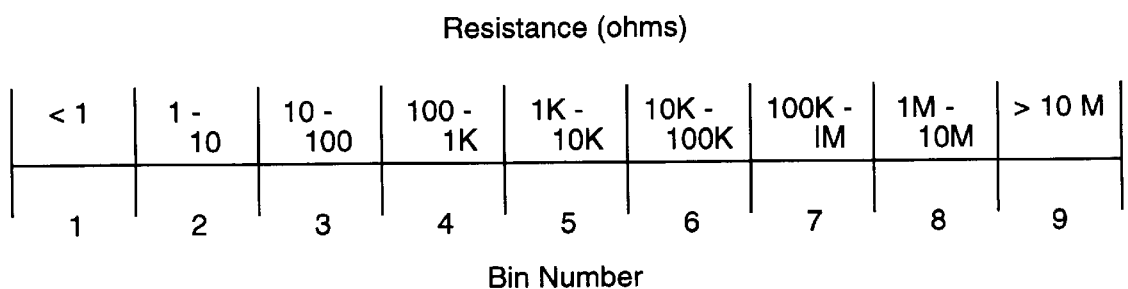
FIG. 5 is a chart illustrating the partitioning of mat resistance values into histogram bins according to a logarithmic distribution.
Figure 7:
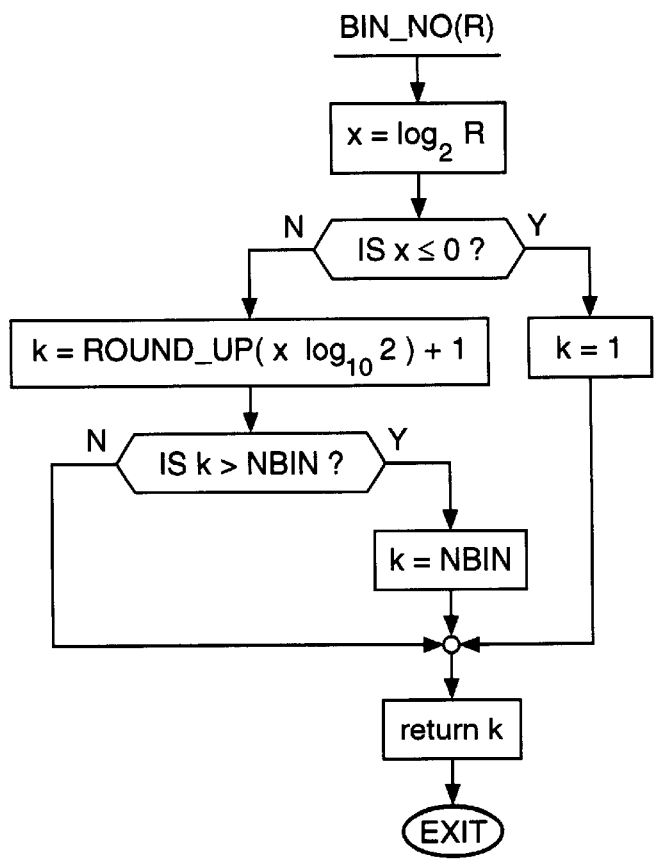
FIG. 7 is a flow chart illustrating the subprogram BIN_NO used to translate mat resistance values to corresponding histogram bin numbers in a representative embodiment of the disclosed invention.

Continuing with the processing represented in the flow chart of FIG. 4b, the index k is next set to the control mat resistance histogram bin number corresponding to the current measured value of the mat resistance R via a call to the subprogram BIN_NO(R). Subprogram BIN_NO(R) is illustrated in FIG. 7 and described subsequently. For the purposes of the representative embodiment of the disclosed invention, random control mat resistance values are assumed to be distributed logarithmically between the extreme values of zero and infinite resistance. This is illustrated in FIG. 5, in which the total number of histogram bins is arbitrarily set to 9. The parameter NBIN, initialized in FIG. 3, makes the number of histogram bins available to the rest of the microprocessor program.

It is important to note that the assumption in the representative embodiment described here that random values of R follow a logarithmic distribution is only a suggested starting point. An essentially limitless number of alternative choices is available to the designer. Likewise, the choice of 9 histogram bins is only illustrative. Neither the use of a different random R value distribution nor a different number of histogram bins alters the essential concepts that are the basis of the disclosed invention and that are illustrated by the representative embodiment described here.

Next in FIG. 4b, the histogram bin HISTO(k) to which the current value of the measured control mat resistance R corresponds is incremented by 1. The histogram array HISTOO is initialized to zero on the RESET interrupt, as illustrated in FIG. 3. In this way, an histogram of the measured control mat resistance values R is built up from samples of R taken at 10 second intervals. The resolution of the histogram is determined by the number of bins, which, in this representative embodiment, is 9. See FIG. 5.

After updating of the histogram bin count HISTO(k) in FIG. 4b, a counter CNTB is next decremented by 1. As shown in FIG. 3, the initial value of CNTB is CNT2. When CNTB is decremented to zero, CNTB is reinitialized to CNT2 and control continues on to further processing of the histogram array HISTO( ). Otherwise, if CNTB is not decremented to zero, interrupts are re-enabled and control is returned to the idle loop shown in FIG. 3 via the EXIT in FIG. 4b. In the representative embodiment of the disclosed invention, CNT2 has the value 100. Therefore, control continues on only on every $100^{th}$ 10 second interval, or once every 16.7 minutes, approximately.

Following the successful decrementing to zero and resetting of the counter CNTB in FIG. 4b, which occurs approximately once every 16.7 minutes, a loop is established in which the values contained in each of the histogram bins in the array HISTO( ) is modified by multiplication by the constant K3. This implements a simple IIR digital filter of the histogram values causing them to decay slowly with time. The purpose is to allow channels, or bins, of the histogram that are no longer active to decay away so that the histogram can adapt to slow variations of the resistance characteristics of the control mat. The value of K3 has been chosen for illustrative purposes, using formula (1), so that the value of an inactive histogram bin will decrease to one-half its original value in 72 hours. At one iteration every 16.7 minutes, the number of "samples" n to be used to calculate K3 from (1) is approximately 259, yielding K3=0.99733.

Figure 4C:
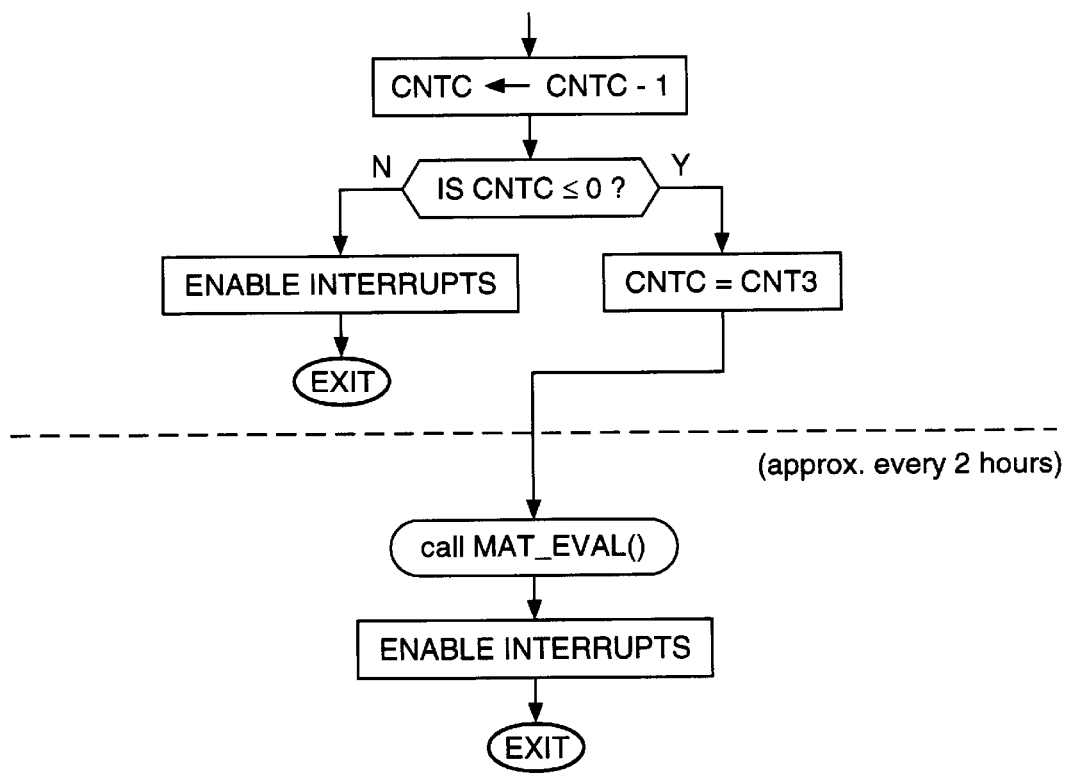

Processing continues on to the top of FIG. 4c where a counter CNTC is next decremented by 1. As shown in FIG. 3, the initial value of CNTC is CNT3. When CNTC is decremented to zero, CNTC is reinitialized to CNT3 and the mat evaluation subprogram MAT_EVAL is called. Otherwise, if CNTC is not decremented to zero, interrupts are re-enabled and control is returned to the idle loop shown in FIG. 3 via EXIT. Subprogram MAT_EVAL, which is described below, analyzes the histogram of the measured control mat resistance values for the purpose of detecting and reporting significant deviations from the characteristics of an ideal mat. In the representative embodiment of the disclosed invention, CNT3 has the value 7. Therefore, the mat evaluation subprogram MAT_EVAL is executed on every $7^{th}$ 16.7 minute interval, or once every 2 hours, approximately.

After execution of the mat evaluation subprogram MAT_EVAL in FIG. 4c, interrupts are re-enabled and control is returned to the idle loop shown in FIG. 3 via EXIT.

Operation on POWER UP and RESET

The disclosed invention is preferentially installed between the door control electronics and the mat leads at the ends of the mat leads farthest from the mat so that the electrical characteristics of both the mat and the associated leads will be evaluated and assessed. The disclosed invention may be realized as a device distinct from the elements conventionally associated with the door control electronics, or it may be incorporated into the door control electronics itself.

Operation begins automatically on POWER UP. As indicated in FIG. 3, only a subset of the initialization of the device occurs on POWER UP. The balance occurs on RESET which, in the representative embodiment described here, is generated when the RESET button shown in FIG. 1 is activated. When the described embodiment is first placed into service, full initialization should be accomplished by activating the RESET button shortly after POWER UP. Thereafter, the device, as described here, will monitor the electrical performance characteristics of the control mat to which it is attached. Immediately after RESET, the device will assume, as an initial condition, that the mat exhibits zero and infinite resistance values characteristic of an ideal mat. Over time, the device will re-adjust its assessment of the characteristics of the mat to conform to those actually pertaining.

When the door is shut down, as at the end of the day, the disclosed invention as described here is shut down as well. On the next POWER UP to resume operation of the door, the values of key derived parameters, such as RMAX, RMIN and the mat resistance histogram HISTO( ), which were left over from the previous period of operation, are utilized. In this way, the device can go on smoothly with its evaluation and assessment of the control mat to which it is attached. There is no need to "relearn" the characteristics of the mat on every POWER UP.

However, under some circumstances, it may be desirable to perform a complete initialization on demand. For example, if the control mat is replaced, so that the ongoing assessment is no longer valid, a complete initialization will have the effect of starting the evaluation and assessment process anew from the default assumption of an ideal mat. The required complete initialization is, in the embodiment of the invention described here, triggered by activation of the RESET button shown in FIG. 1.

Mat Evaluation Subprogram MAT_EVAL

The purpose of the mat evaluation subprogram MAT_EVAL is to analyze the histogram of the measured control mat resistance values for the purpose of detecting and reporting significant deviations from the characteristics of an ideal mat. For purposes of illustration, in the representative embodiment of the disclosed invention, the minimum and maximum resistance values exhibited by the control mat and the possible occurrence of bad spots are examined and reported if outside acceptable limits.

Warning of unacceptable control mat characteristics is via the setting of the variables BAD_SPOT, HI_END and LO_END to non-zero values. These represent and report the detection of bad spots on the control mat and unacceptable drift of the maximum and minimum mat resistance values, respectively. The details of how the setting of these variables is translated into the corresponding external signals BAD_SPOT, HI_END and LO_END shown as outputs of the microprocessor 12 in FIG. 1 will be to some extent microprocessor dependent but, in any case, will be obvious to those skilled in the use and application of such microprocessors and the techniques of real time process control. These details are not illustrated or discussed here.

Figure 6A:
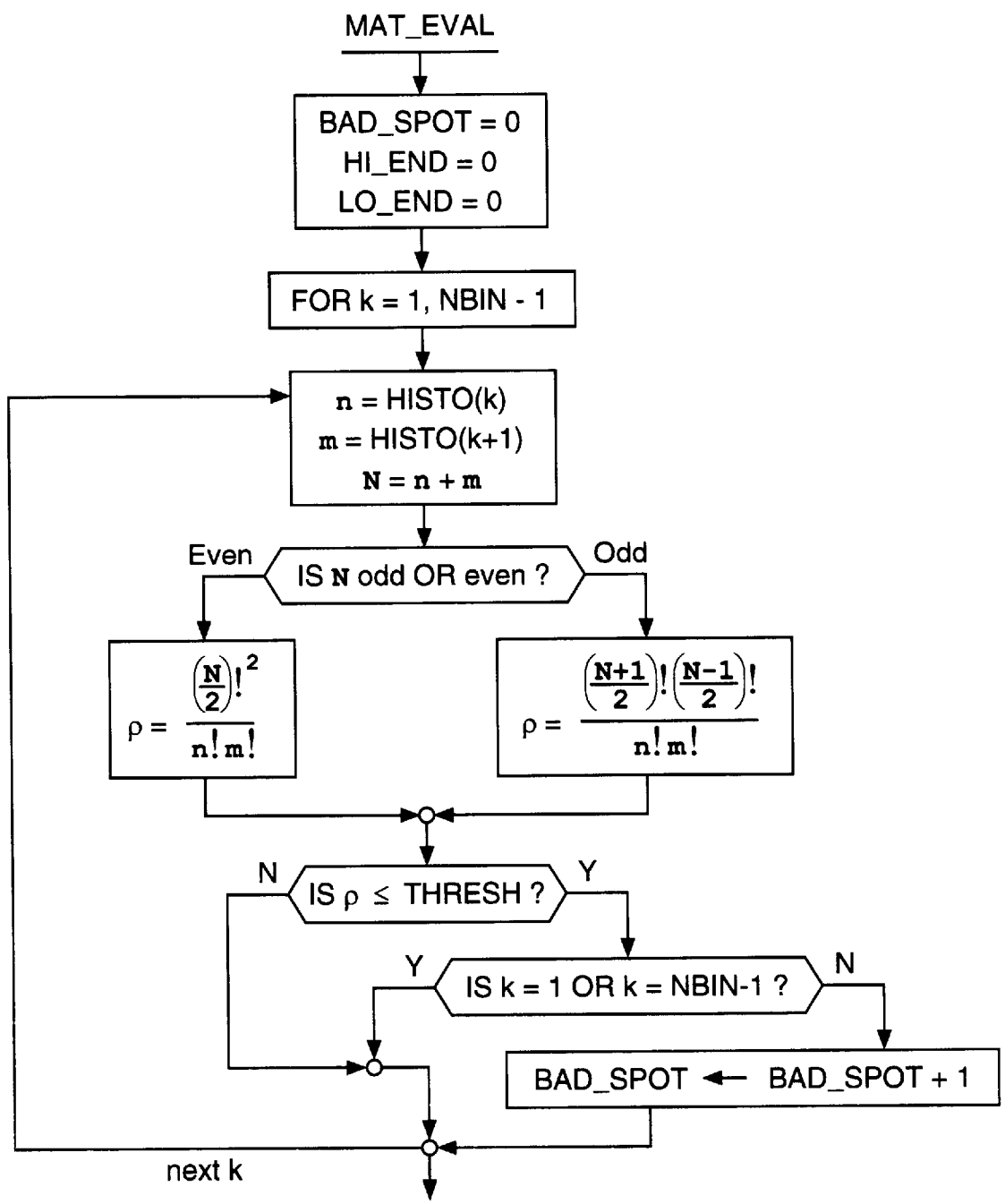
FIGS. 6a and 6b are flow charts illustrating the subprogram MAT_EVAL used to evaluate the condition of the control mat in a representative embodiment of the disclosed invention.

Referring now to FIG. 6a, processing within subprogram MAT_EVAL begins by initializing the three reporting variables BAD_SPOT, HI_END and LO_END to zero. In this state, each variable signifies that the corresponding mat characteristic is within acceptable limits. If, in the balance of the processing within MAT_EVAL, the characteristic represented by a variable is found to be outside acceptable limits, that variable will be set to a non-zero value and will remain so on termination of execution of MAT_EVAL. On the other hand, if found to be within acceptable limits, the corresponding variable will remain equal to zero on termination of execution of MAT_EVAL. In this way, the values of the variables BAD_SPOT, HI_END and LO_END on termination of subprogram MAT_EVAL serve to report the current condition of the control mat.

Next in FIG. 6a, a loop is established in which the bins of the control mat resistance histogram are examined for the occurrence of possible bad spots, or other irregularities that are manifest as excessive bin-to-bin fluctuations of histogram counts. The range of the loop extends to the bottom of the flow chart in FIG. 6a.

Mat bad spots, and other irregularities, manifest themselves as local peaks in the control mat resistance histogram, other than those anticipated corresponding to zero and infinite resistance for an ideal mat. The algorithm chosen for illustrative purposes in the representative embodiment of the disclosed invention assumes that purely random values of the measured mat resistance will occur with equal probability in adjacent bins of the control mat resistance histogram. Such random values, if they occur at all, might result, for example, from artifacts produced by the mat resistance measuring device 11.

The illustrative algorithm calculates the probability of occurrence of the counts actually recorded in each pair of adjacent bins of the histogram relative to the probability that the total number of counts within the two adjacent bins would be distributed equally between the two bins. Thus, the more unevenly divided the total number of counts within two adjacent bins, the less the relative probability of occurrence of that distribution, if the resistance counts occur purely randomly with equal probability within each of the two adjacent bins. If the calculated probability of the actual distribution of counts within two adjacent bins falls below a threshold value THRESH initialized in FIG. 3, the distribution is considered to be too improbable to have been due to a random fluctuation and, rather, to be indicative of the presence of a mat bad spot or other functional irregularity. The reporting variable BAD_SPOT is incremented by 1 for every such occurrence. Therefore, on termination of subprogram MAT_EVAL, variable BAD_SPOT will contain an estimate of the number of bad spots on the control mat.

The foregoing algorithm for detecting the occurrence of mat bad spots has the advantage that it becomes relatively insensitive to variations of counts between adjacent bins of the control mat resistance histogram when the number of counts is low. That is, a given absolute difference between the counts in two adjacent histogram bins is more likely to be reported as a mat bad spot, rather than a random event, if the number of counts in the two bins is high. This corresponds to the natural tendency of the standard deviation of the sum of samples from a random distribution to decrease with increased sample number. It is advantageous here because it allows the algorithm to start, as it necessarily does, with low histogram count values without falsely reporting the occurrence of mat bad spots.

It should be noted that the algorithm described here for detecting mat bad spots and irregularities is intended for illustrative purposes and is but one of a very large number of possible alternative algorithms and variations known to those skilled in the art that could be used for the purpose. For example, the histogram data could be "fitted" by a series of "Lorentzian" curves and the resulting set of curves examined for evidence of bad spots. This technique finds application in spectroscopy to identify and separate spectral lines in noisy data. Likewise, Fourier and other transform techniques could be used to spot significant peaks in the histogram data. Or, much more pedestrian ad hoc "hill climbing" techniques could be employed. All such methods, and others known to those skilled in the art, are considered to fall within the scope of the disclosed invention.

Returning to the processing illustrated in FIG. 6a, the first step within the loop on all pairs of adjacent histogram bins is to set variables n and m to the number of counts in each of the two currently selected (via index k) adjacent mat resistance histogram bins. Variable N is set to the sum of the counts in the two adjacent bins, n+m. The relative probability p of counts m and n in the two adjacent histogram bins is then calculated. If the total number of counts N in the two adjacent bins is even, the relative probability of n counts in one bin and m counts in the other is given by $$p = \frac{\left(\frac{N}{2}\right)!^2}{n!m!}. \quad (2)$$

And, if the total number of counts N in the two adjacent bins is odd, the relative probability of n counts in one bin and m counts in the other is given by $$p = \frac{\left(\frac{N+1}{2}\right)!\left(\frac{N-1}{2}\right)!}{n!m!}. \quad (3)$$

If the relative probability of the occurrence of n counts in one bin and m counts in the adjacent bin falls below the threshold value THRESH, and if the first of the two bins is not bin 1 and the second of the two bins is not the last bin, NBIN, the estimate of the number of mat bad spots BAD_SPOT is incremented by 1. Bins 1 and NBIN are excluded to prevent counting the anticipated histogram peaks corresponding to zero resistance and infinite resistance, characteristic of an ideal mat, as mat bad spots. If the value of the relative probability is above the threshold value THRESH, the bad spot counter BAD_SPOT is not incremented.

Processing within the loop as described is repeated for all possible pairs of adjacent mat resistance histogram bins.

It will be noted that, because of the decay of the histogram counts due to the digital filter involving K3 (bottom of FIG. 4b), counts in the histogram bins will generally not be integers, whereas formulas (2) and (3) for the relative probability are defined only for integer values of n, m and N. This difficulty can be circumvented in a number of ways. First, and not necessarily the most practical, the factorials in (2) and (3) can be replaced by the gamma function of the continuous variable x using the relationship $$x! = \Gamma(x+1). \quad (4)$$

A better solution is to replace the discrete functions (2) and (3) with suitably parametrized approximating continuous functions, such as the normal (Gaussian) distribution function. Yet another solution is to use a different method altogether for spotting mat bad spots, as already discussed.

It will be noted also that the algorithm shown in FIG. 6a and described above will interpret and count displaced values of the minimum and maximum control mat resistance as "bad spots" if the extreme resistance values drift out of the first and last histogram bins, respectively. The logic required to correct such a miscount is obvious. It has been omitted from the representative embodiment of the disclosed invention described here in order not to obscure the underlying essential ideas and concepts. In any case, the goal of providing a timely warning of the need to replace a deteriorating control mat is not compromised by over-counting the number of mat bad spots.

Figure 6B:
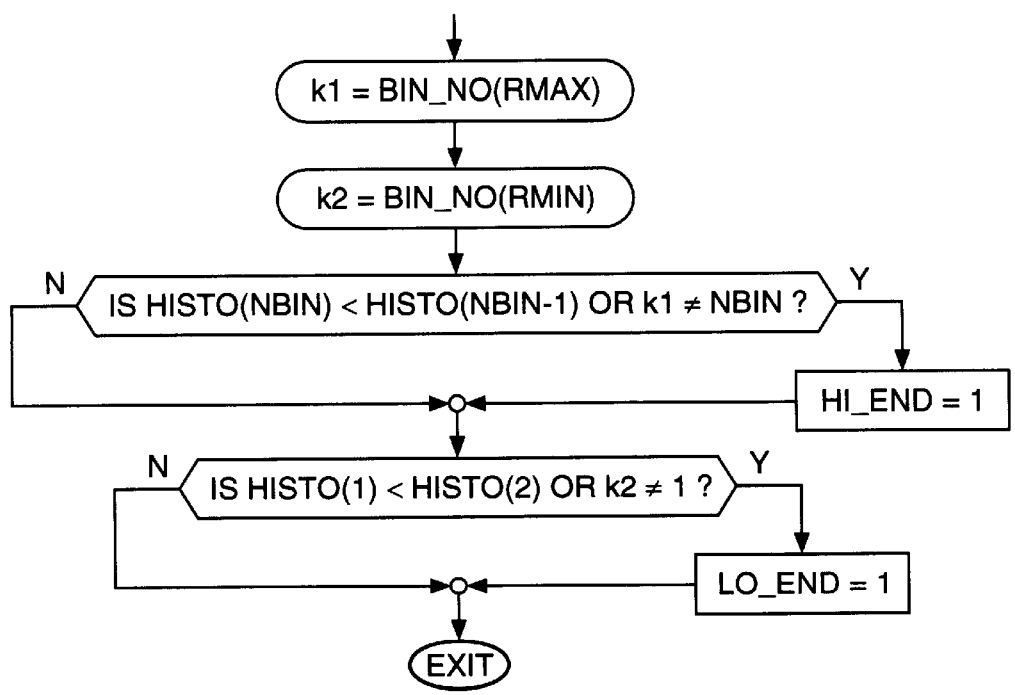

The balance of the processing by subprogram MAT_EVAL is illustrated in the flow chart in FIG. 6b and concerns the monitoring of the minimum and maximum control mat resistance values. First, indices k1 and k2 are set via calls to the subprogram BIN_NO to the mat resistance histogram bin numbers that correspond to the current estimates of the maximum and minimum control mat resistance, RMAX and RMIN, respectively. Then, if either the bin number k1 corresponding to RMAX does not equal the last histogram bin, NBIN, or the number of counts in the last histogram bin HISTO(NBIN) is not equal to or greater than the number of counts in the next-to-last histogram bin HISTO(NBIN-1), the reporting variable HI_END is set non-zero. Likewise, if either the bin number k2 corresponding to RMIN does not equal the first histogram bin, or the number of counts in the first histogram bin HISTO(1) is not equal to or greater than the number of counts in the second histogram bin HISTO(2), the reporting variable LO_END is set non-zero. In this way, anomalous drift of the minimum and maximum control mat resistance values away from zero and infinity characteristic of an ideal mat are reported via the setting of the variables LO_END and HI_END, respectively.

Control is returned to the calling program upon termination of the execution of subprogram MAT_EVAL via the EXIT at the bottom of FIG. 6b.

Histogram Bin Number Subprogram BIN_NO( )

The logic of subprogram BIN_NO( ) is illustrated in the flow chart shown in FIG. 7.

Subprogram BIN_NOO translates a mat resistance value R into the index k of the corresponding mat resistance histogram bin. See FIG. 5. The algorithm used by BIN_NO(), as illustrated in FIG. 7, is based on the assumption of a logarithmic distribution of mat resistance values between zero and infinity, and is parametrized to yield a total of 9 bins over this range. It will be immediately obvious to those skilled in the art how to adjust the parametrization of BIN_NO( ) to yield any other desired number of bins. The representative embodiment of the disclosed invention will work also with other choices of the number of mat resistance histogram bins.

Subprogram BIN_NO( ) reflects the assumption that, in a digital computer, it is easier to compute base-2 logarithms, than any other base. Hence, the first operation within BIN_NO( ) is to assign the base-2 logarithm of the supplied value R to the variable x. However, any other logarithm base can be used with the appropriate straightforward modifications to BIN_NO( ), which will be immediately obvious to those skilled in the art.

If x is less than or equal to zero, the supplied value of R was less than or equal to 1. In this case, the index k is returned with the value 1, corresponding to a resistance value falling within the range covered by the first histogram bin (see FIG. 5). On the other hand, if x, the base-2 logarithm of R, is greater than zero, k is computed by rounding up to the next highest integer the product of x with the log of 2 to the base 10, and then adding 1. This yields the correct bin number according to the layout shown in FIG. 5 for values of R up to 100 million. For values of R greater than 100 million, the returned index k is simply set to the maximum allowed value NBIN.

Control is returned to the calling program upon termination of the execution of subprogram BIN_NO( ) via the EXIT at the bottom of FIG. 7.

ILLUSTRATIVE EXAMPLES

Figure 8A:
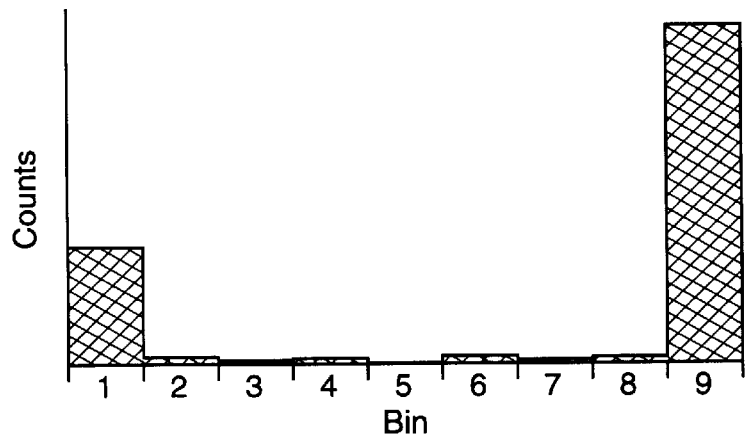
FIGS. 8a, 8b and 8c are sets of three schematic mat resistance histograms illustrating essential characteristics of normal and deteriorated mats.
Figure 8B:
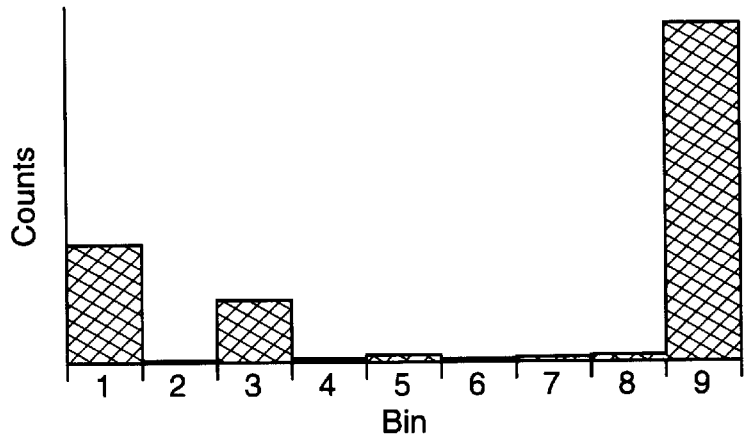
Figure 8C:
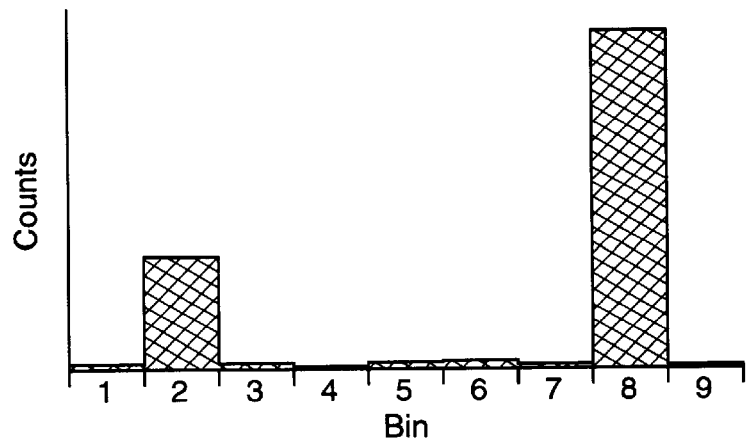

FIGS. 8a, 8b and 8c schematically illustrate three distinct mat resistance histograms. FIG. 8a illustrates the essential features of the histogram corresponding to an ideal mat. Note that there are two clear peaks, one at bin zero and the other at the last (rightmost) bin, corresponding to the zero and infinite mat resistance values exhibited by an ideal mat when an object or person is on the mat, and when there is nothing on the mat, respectively. There are very small counts in the bins intermediate between the first and the last. These represent possible artifacts of the mat resistance measurement process and are of a correspondingly low level. The mat evaluation subprogram MAT_EVAL will yield zero for the value of all three reporting variables BAD_SPOT, LO_END and HI_END if presented with an histogram of the type illustrated in FIG. 8a.

FIG. 8b illustrates a mat resistance histogram resulting from a control mat that has developed a "bad spot" exhibiting a resistance value in the range of 10 to 100 ohms, which appears as a peak at bin 3. See FIG. 5 for the relationship between histogram bin numbers and the corresponding resistance ranges. The mat evaluation subprogram MAT_EVAL will yield zero for the value of the reporting variables LO_END and HI_END and the value 1 for the variable BAD_SPOT if presented with an histogram of the type illustrated in FIG. 8b.

Finally, FIG. 8c illustrates a mat resistance histogram resulting from a control mat in which the minimum and maximum resistance values exhibited by the mat have drifted outside the range of the first and last bins, respectively. This is evidenced by the two peaks, one at bin 2 and one at bin 8. In particular, the minimum resistance value of the mat has drifted upward into the range of 1 to 10 ohms, and the maximum resistance value has drifted downward into the 1 M to 10 M range. The relationship between histogram bin numbers and corresponding resistance ranges is shown in FIG. 5. The mat evaluation subprogram MAT_EVAL will yield the value 1 in the reporting variables LO_END and HI_END and the value 2 for the variable BAD_SPOT if presented with an histogram of the type illustrated in FIG. 8b. This is an example of the phenomenon mentioned earlier of over-estimation of the number of mat bad spots by subprogram MAT_EVAL. Here there are actually no bad spots but, rather, two histogram peaks at positions intermediate between the first and last histogram bins, which actually result from drift of the minimum and maximum mat resistance values.

What is claimed is:

1. A control mat monitoring apparatus comprising:
    a) means for developing an electronic signal value proportional to the time-varying value of the electrical resistance of a control mat in the course of normal use,
    b) means for continuously recording and updating the statistical distribution of the value of said electronic signal value, said statistical distribution having upper and lower limits and other characteristic statistical features generally evolving with time,
    c) means for generating a detection signal based on the dynamic relationship of, and between, said electronic signal value and said evolving upper and lower limits of said statistical distribution, and
    d) means for generating a mat failure warning signal based on said evolving characteristic statistical features of said statistical distribution,
whereby a detection signal is generated in a manner that compensates dynamically for changes in the electrical resistance characteristics of said control mat and a timely warning is provided of pending mat failure.

2. The control mat monitoring apparatus of claim 1 wherein said means for generating a detection signal are based on the dynamic relationship of, and between, said electronic signal value and said evolving characteristic statistical features of said statistical distribution.

3. A method for monitoring control mats comprising:
    a) developing an electronic signal value proportional to the time-varying value of the electrical resistance of a control mat in the course of normal use,
    b) continuously recording and updating the statistical distribution of the value of said electronic signal value, said statistical distribution having upper and lower limits and other characteristic statistical features generally evolving with time,
    c) generating a detection signal based on the dynamic relationship of, and between, said electronic signal value and said evolving upper and lower limits of said statistical distribution, and
    d) generating a mat failure warning signal based on said evolving characteristic statistical features of said statistical distribution,
whereby a detection signal is generated in a manner that compensates dynamically for changes in the electrical resistance characteristics of said control mat and a timely warning is provided of pending mat failure.

4. The control mat monitoring method of claim 3 wherein said generating of a detection signal is based on the dynamic relationship of, and between, said electronic signal value and said evolving characteristic statistical features of said statistical distribution.

* * * * *